United States Patent
Lynch et al.

(10) Patent No.: US 6,847,317 B2
(45) Date of Patent: Jan. 25, 2005

(54) SYSTEM AND METHOD FOR A DYADIC-MONOTONIC (DM) CODEC

(75) Inventors: William C. Lynch, Palo Alto, CA (US); Krasimir D. Kolarov, Menlo Park, CA (US); Steven E. Saunders, Cupertino, CA (US)

(73) Assignee: Droplet Technology, Inc., Cupertino, CA (US)

( * ) Notice: Subject to any disclaimer, the term of this patent is extended or adjusted under 35 U.S.C. 154(b) by 0 days.

(21) Appl. No.: 10/447,467

(22) Filed: May 28, 2003

(65) Prior Publication Data

US 2004/0012512 A1 Jan. 22, 2004

Related U.S. Application Data

(60) Provisional application No. 60/385,251, filed on May 28, 2002.

(51) Int. Cl.[7] .............................. H03M 7/00; H03M 7/40
(52) U.S. Cl. ......................................... 341/107; 341/67
(58) Field of Search .......................... 341/107, 65, 67; 375/240.11, 240.16, 240.19; 382/166, 240, 248, 246; 708/402; 345/660; 711/125

(56) References Cited

U.S. PATENT DOCUMENTS

| | | | | |
|---|---|---|---|---|
| 3,748,379 A | * | 7/1973 | Epstein et al. | 382/245 |
| 3,758,873 A | * | 9/1973 | Miller | 331/78 |
| 4,146,743 A | * | 3/1979 | Raynham | 375/361 |
| 5,854,809 A | * | 12/1998 | Swanson et al. | 375/240 |
| 5,893,145 A | | 4/1999 | Thayer et al. | 711/125 |
| 6,141,673 A | | 10/2000 | Thayer et al. | 708/402 |
| 6,144,773 A | | 11/2000 | Kolarov et al. | 382/240 |
| 6,148,110 A | | 11/2000 | Yajima et al. | 382/240 |
| 6,195,465 B1 | | 2/2001 | Zandi et al. | 382/248 |
| 6,229,929 B1 | | 5/2001 | Lynch et al. | 382/268 |
| 6,272,180 B1 | * | 8/2001 | Lei | 375/240.16 |
| 6,332,043 B1 | | 12/2001 | Ogata | 382/240 |
| 6,360,021 B1 | | 3/2002 | McCarthy et al. | 382/254 |
| 6,381,280 B1 | * | 4/2002 | Lynch et al. | 375/240.19 |
| 6,396,948 B1 | | 5/2002 | Lynch et al. | 382/166 |
| 6,407,747 B1 | | 6/2002 | Chui et al. | 345/660 |
| 6,516,030 B1 | | 2/2003 | Lynch et al. | 375/240.11 |
| 6,625,321 B1 | * | 9/2003 | Li et al. | 382/239 |
| 6,677,868 B2 | * | 1/2004 | Kerofsky et al. | 341/107 |

OTHER PUBLICATIONS

Kolarov et al., "Video Compression for the Portable and Wireless Markets," Dec. 2002, Droplet Technology, Inc., White Paper.

(List continued on next page.)

*Primary Examiner*—Patrick Wamsley
(74) *Attorney, Agent, or Firm*—Zilka-Kotab, PC

(57) ABSTRACT

A coder and/or decoder system and method are provided including a variable modulus. As an option, the modulus may reflect a steepness of a probability distribution curve associated with a compression algorithm (i.e. a negative exponential of the probability distribution). Moreover, the modulus may depend on a context of a previous set of data, while avoiding increasing as a function of a run length (i.e. a plurality of identical bits in a sequence).

21 Claims, 3 Drawing Sheets

OTHER PUBLICATIONS

D. LeGall and A. Tabatabai, "Sub-band coding of digital images using symmetric short kernel filters and arithmetic coding techniques", IEEE International Conference on Acoustics, Speech and Signal Processing, New York, NY, pp. 761–765, 1988.

ISO/IEC 15444–1 JPEG 2000 image coding system—Part 1: Core coding system, Mar. 2000.

R. Crochiere and L. Rabiner, Multirate Digital Signal Processing, Prentice Hall 1983.

ISO/IEC JTC 1/SC 29/WG 1 N1646 Coding of Still Pictures, Mar. 16, 2000.

ISO/IEC 11172–2:1993 Coding of moving pictures and audio at up to 1,5 Mbit/s—Part 2: Video.

ISO/IEC 10918–1 Digital compression and coding of continuous-tone still images: Requirements and guidelines, 1992.

ISO/IEC 13818–2:1995 Coding of moving pictures and associated audio: Part 2. Video.

ISO/IEC 14496–2 MPEG–4 Part 2: Visual, Apr. 1999.

* cited by examiner

| | A | B | C | D | E | F | G | H | I | J | K | L |
|---|---|---|---|---|---|---|---|---|---|---|---|---|
| 1 | COMBINED ENCODE AND DECODE | | | | | | | | | | | |
| 2 | | | | | | | | | | ENCODE ACTIONS | DECODE ACTIONS | |
| 3 | PREDICATES | | | | | COMMON ACTIONS | | | | | | |
| 4 | | | | $2^{-1}$ of Aregister | | eol | | | next | encode | | decode |
| 5 | | | | | | | | | | | | |
| 6 | P | M | $==1$ | $shift == 0$ | $a ==$ <end> | Aregister | shift | context | P | b | Cregister | a |
| 7 | initialize decode | | | | | | | | | | | |
| 8 | start | | | | | FALSE | 0 | $2^{-n}$ | initial | p2 | | advance |
| 9 | p2 | | | | | TRUE | | advance | | p2 | | advance |
| 10 | p2 | | | | | | | | | p3 | | |
| 11 | | | | | | | | | | | | |
| 12 | mps | | | | | | | | | | | |
| 13 | p3 | TRUE | FALSE | | | Aregister + delta | | advance | p3 | | | mps(context) |
| 14 | p3 | TRUE | TRUE | | | advance | | | p3 | $2^{-1}$ of Aregister | advance | |
| 15 | | | | | | | | | | | | |
| 16 | lps | | | | | | | | | | | |
| 17 | p3 | FALSE | | | | | delta | | p4 | | | |
| 18 | p4 | | | | FALSE | advance | advance | | p4 | $2^{-1}$ of Aregister | advance | |
| 19 | p4 | | | | TRUE FALSE | | | advance | p3 | | | (mps(context)) xor 1 |
| 20 | | | | | | | | | | | | |
| 21 | finalize | | | | | | | | | | | |
| 22 | p4 | | | | TRUE TRUE | | | | finish | <end> | | <end> |

M: ((mps(context)==a) & encode) or ((Aregister < Cregister) & decode)
M is FALSE if a==<end> advance: Aregister = ($2^*$Aregister mod 1)
delta is a fixed function of context advance: shift = ($2^*$shift mod 1)

advance: context = ($2^*$context mod $2^k$)+a;
remove a from front of input string
a is the decode symbol append $2^{-1}$ of Aregister to the code output string
before advancing the Aregister
advance:
  Cregister = ($2^*$Cregister mod 1)+b*$2^{-n}$;
  b is the next input code symbol
  and is removed from the code input string

NOTES

An empty cell is interpreted as an unchanged value
dyadic condition: delta(context) = $2^{-m}$  $0 < m <= n$
monotonic condition: delta(context) >= delta(($2^*$context mod $2^k$)+mps(context))

F9   Could be "advance". The Aregister is zero
F14  Could be 0. The Aregister is $2^{-1}$ before the step and zero after the step
J14  Could be 1. The Aregister is $2^{-1}$ before the step and zero after the step
F19  The Aregister is zero during this step
F22  The Aregister is zero during this step The sequence of values of P generated by decoding an encoded string is exactly the sequence generated by the original encoding.
The sequence of values of the predicates is also the exactly the same in encoding a string and in decoding that coded string.

SYSTEM AND METHOD FOR A DYADIC-MONOTONIC (DM) CODEC

RELATED APPLICATION(S)

The present application claims priority from a provisional application filed May 28, 2002 under Ser. No. 60/385,251, which are each incorporated herein by reference in their entirety.

FIELD OF THE INVENTION

The present invention relates to data compression, and more particularly to compressing data utilizing codecs.

BACKGROUND OF THE INVENTION

An encoder is a process which maps an input sequence of symbols into another, coded, sequence of symbols in such a way that another process, called a decoder, is able to reconstruct the input sequence of symbols from the coded sequence of symbols. The encoder and decoder pair together are referred to as a "codec."

As shorthand, a finite sequence of symbols is often referred to as a string so one can refer to the input string and the coded string. Each symbol of an input string is drawn from an associated, finite, alphabet of input symbols I. Likewise, each symbol of a coded string is drawn from an associated, finite alphabet of code symbols C.

Each alphabet contains a distinguished symbol, called the <end> symbol. Each and every string terminates in the associated <end> symbol and the <end> symbol may only appear at the terminal end of a string. The purpose of the <end> symbols is to bring the codec processes to an orderly halt.

Any method of determining the end of an input or code string can be used to synthesize the effect of a real or virtual <end> symbol. For example, in many applications the length of the input and/or the coded string is known and that information may be used in substitution for a literal <end> string.

The encoder mapping may be denoted by $\Phi$ so that if u is an input string and v is the corresponding coded string, one can write: $v=\Phi(u)$. Likewise, the decoder mapping will be denoted by $\Psi$ and one can write: $u=\Psi(v)$, with the requirement that: $u=\Psi(\Phi(u))$.

There is no requirement for $\Phi(\Psi(v))$ to reconstruct v. A codec $(\Phi,\Psi)$ is called a binary codec if the associated alphabets I and C each contain just two symbols in addition to the <end> symbol. If a, b, and <end> are the three symbols in a binary alphabet, the useful function ~ is defined to be: ~a=b, ~b=a, ~<end>=<end>.

Codecs, as described so far, do not have a practical implementation as the number of input strings (and the number of code strings) is infinite. Without placing more structure and restrictions on a codec, it cannot be feasibly implemented in a finite machine, much less have a practical implementation.

A significant subset of codecs can be practically implemented by the well-known finite state transducer. A finite state transducer (FST) is an automaton that sequentially processes a string from its initial symbol to its terminal symbol <end>, writing the symbols of the code string as it sequences. Information is sequentially obtained from the symbols of the input string and eventually represented in the code string.

To bridge the delay between obtaining the information from the input string and representing it in the code string, the FST maintains and updates a state as it sequences. The state is chosen from a finite set of possible states called a state space. The state space contains two distinguished states called <start> and <finish>. The FST initiates its process in the <start> state and completes its process in the <finish> state. The <finish> state should not be reached until the <end> symbol has been read from the input string and an <end> symbol has been appended to the code string.

Because the state space is finite, it is not possible to represent every encoder as an FST. For reasons of practicality, the present description focuses on codecs where both the encoder and decoder can be described and implemented as FSTs. If the encoder $\Phi$ can be implemented as an FST, it can be specified by means of an update function $\phi$. The first input symbol a from the input string is combined with the current state s1 and produces the next state s2. The first symbol is conditionally removed from the beginning of the input string. The produced code symbol b is conditionally appended to the code string.

The function $\phi$ is undefined if the current state is <finish> and the FST terminates sequencing. To summarize: $(s_2, b)=(\phi_s(s_1, a), \phi_b(s_1, a))=\phi(s_1, a)$. Here, $\phi_s(s_1, a)$ is by definition the first component of $\phi(s_1, a)$ and $\phi_b(s_1, a)$ is by definition the second component of $\phi(s_1, a)$.

For many applications, including entropy coding, it is useful to equip the FST with a Markovian probability structure. Given a state $s_1$ and an input symbol a, there is a probability $\text{Prob}(a|s_1)$ that, given the FST is in state $s_1$, that a will be the next symbol read. Depending on the application, this probability may be stipulated, may be statically estimated from historical data, or may be dynamically estimated from the recent operation of the FST. In this latter case, the information on which the probability estimate is based may be encoded in the state space.

From this, one can calculate $\text{Prob}(s_2|s_1)$, the probability that, given the FST in state $s_1$, that the FST will next be in state $s_2$. This is calculated by case analysis as: $\text{Prob}(s_2|s^1)=(\phi s(s_1, a)==s_2) \text{Prob}(a|s_1)+(\phi s(s_1, \sim a)==s_2)\text{Prob}(\sim a|s_1)$.

This set of Markovian state transition probabilities can be assembled into a stochastic matrix M where $M_{ij}=\text{Prob}(s_j|s_i)$. The asymptotic state probabilities P(s) can be calculated as the elements of the right eigenvector of M corresponding to the largest eigenvalue 1.

DISCLOSURE OF THE INVENTION

A coder and/or decoder system and method are provided including a variable modulus.

In one embodiment, the modulus may reflect a steepness of a probability distribution curve associated with a compression algorithm. For example, the modulus may include a negative exponential of the probability distribution. As an option, the probability distribution is associated with a codec.

In another embodiment, the modulus may depend on a context of a previous set of data. Moreover, the modulus may avoid increasing as a function of a run length (i.e. a plurality of identical bits in a sequence).

In still another embodiment, the codec may be designed to utilize a minimal computational complexity given a predetermined, desired performance level.

BRIEF DESCRIPTION OF THE DRAWINGS

FIG. 3 shows a transition table illustrating an update function for both an encoder and decoder, in accordance with one embodiment.

DESCRIPTION OF THE PREFERRED EMBODIMENTS

Figure 1:
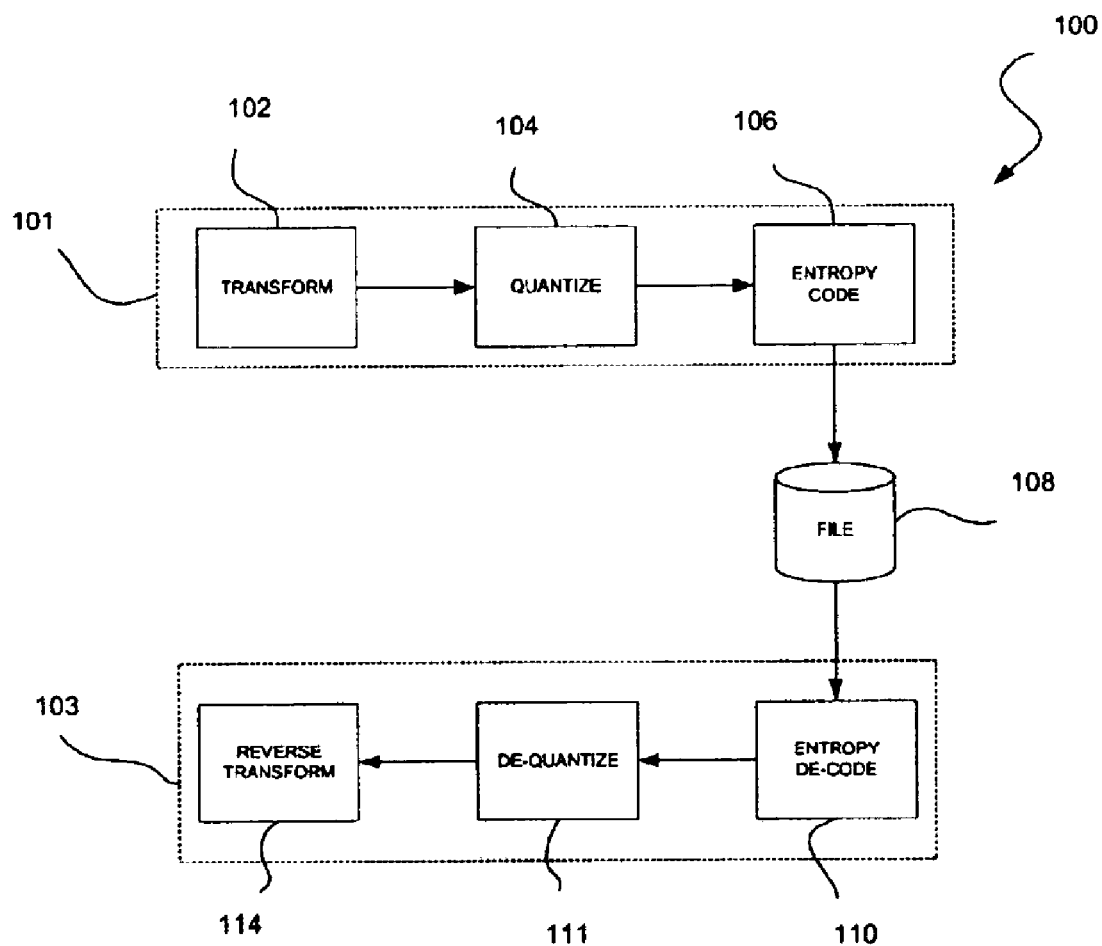
FIG. 1 illustrates a framework for compressing/decompressing data, in accordance with one embodiment.

FIG. 1 illustrates a framework 100 for compressing/decompressing data, in accordance with one embodiment. Included in this framework 100 are a coder portion 101 and a decoder portion 103, which together form a "codec." The coder portion 101 includes a transform module 102, a quantizer 104, and an entropy encoder 106 for compressing data for storage in a file 108. To carry out decompression of such file 108, the decoder portion 103 includes a reverse transform module 114, a de-quantizer 111, and an entropy decoder 110 for decompressing data for use (i.e. viewing in the case of video data, etc).

In use, the transform module 102 carries out a reversible transform, often linear, of a plurality of pixels (i.e. in the case of video data) for the purpose of de-correlation. Next, the quantizer 104 effects the quantization of the transform values, after which the entropy encoder 106 is responsible for entropy coding of the quantized transform coefficients. The various components of the decoder portion 103 essentially reverse such process.

In one embodiment, the coder portion 101 and/or decoder portion 103 may include a variable modulus. In the context of the present description, the modulus may reflect a steepness of a probability distribution curve associated with a compression algorithm utilized by the codec framework 100. For example, the modulus may include a negative exponential of the probability distribution.

While the modulus may vary as a function of any desired parameter, the modulus may, in one embodiment, depend on a context of a previous set of data, where such set of data may refer to a set of bits being processed by the various modules of the codec framework 100. Moreover, the modulus may avoid increasing as a function of a run length (i.e. a plurality of identical bits in a sequence).

A dyadic-monotonic (DM) codec framework may thus be provided. More information regarding optional ways in which the modulus may depend on a context of a previous set of data, the modulus may avoid increasing as a function of a run length, etc. will be set forth hereinafter in greater detail.

Figure 2:
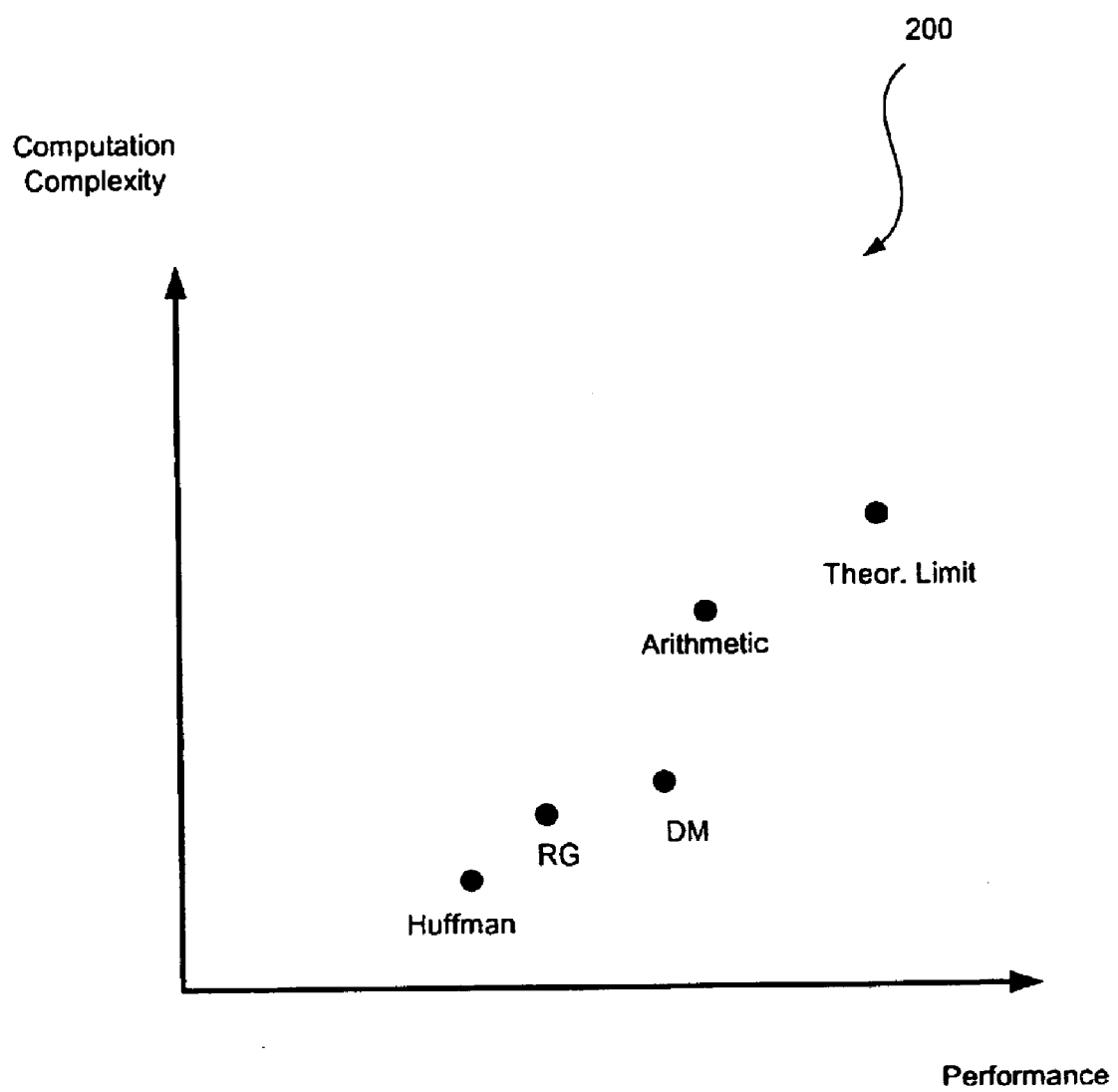
FIG. 2 is a computational complexity v. performance level graph illustrating a relationship of the present dyadic-monotonic (DM) codec framework and other algorithms.

FIG. 2 is a computational complexity v. performance level graph 200 illustrating a relationship of the present dyadic-monotonic (DM) codec framework and other algorithms (i.e. Huffman, Rice Golomb, arithmetic, etc.). As shown, the DM codec framework may be designed to utilize a minimal computational complexity given a predetermined performance level.

More information regarding various optional features that may be implemented in the context of the codec framework of FIG. 1 will now be set forth. In one embodiment, the DM codec may be specified by describing the state space and update function thereof (see Background section).

Each state has five components, the position P, the context, the shift, the Aregister, and the Cregister. As mentioned earlier, the modulus may vary based on a context of a previous set of data. In accordance with a specific embodiment meeting the aforementioned definition of a "context," the present context may include a bit string of length k over the input alphabet (total $2^k$ states). Each of the Aregister and Cregister may hold a non-negative multiple of $2^{-n}$ that is less than one (total $2^n$ states each). In both the <start> state and the <finish> state, both the Aregister and the Cregister have the value zero. The context value for the <start> state, initial, though arbitrary, may be necessarily the same for both the encoder and decoder. The P value in the <start> state is start and in the <finish> state is finish. The shift value is irrelevant in the <start> and <finish> states.

As a part of the specification of the update function $\phi$ there are some specified fixed functions. See Table 1.

TABLE 1

1. The function mps maps each context value to a value in the input alphabet I. The intention is that mps is the symbol in I that is the more probable symbol given the context.
2. The function delta maps each of the $2^k$ context values to $2^{-m}$ where $0 < m \leq n$. The intention of the function delta is that it quantitatively captures the information about the probability of the value of the next symbol.

These two functions may be chosen subject to the DM constraints. These constraints, together with probability information, may be used in choosing mps and delta and enable a useful combination of algorithm simplicity and entropy coding efficiency in important applications.

In one embodiment, the DM constraints are those set forth in Table 2.

TABLE 2

1) The Dyadic constraint:
delta(context) = $2^{-m}$ $0 < m \leq n$
where m and n are integers, requires that delta be a negative integral power of two. It is intended that delta(context) approximate the conditional probability that the next symbol will not necessarily be the one given by mps(context). 1-Prob(a == mps(context)| context) ≈ delta(context)
2) The Monotonic constraint:
(1-delta(context)) $\leq$ (1-delta((2*context mod $2^k$) + mps(context)))
The right hand side of such inequality is approximately the probability of reading the most probable symbol given that the previously read symbol was also most probable. The monotonic constraint reflects the plausible situation where a more probable symbol does not decrease the probability that the next symbol will be most probable.

These two constraints provide an effective entropy codec.

FIG. 3 shows a transition table 300 illustrating an update function for both an encoder and decoder, in accordance with one embodiment. Each line represents a set of states, where the states of the set are those that satisfy each of the conditions in the predicate columns. Each row forms a partition of the allowable states.

After the proper row is identified for the initial state, the actions in the right hand part of the row are executed. All values utilized are values at the initial state, so action sequence within a row is not necessarily an issue. Each component of the new state may receive a unique value. Blank entries mean that that component of the state is unchanged.

For the encoder, the update actions from the "common" group of columns and the update actions from the "encoder" group of columns are carried out. For the decoder, the actions are chosen from the "common" and "decoder" groups of columns. At the bottom of the state transition table 300, precise definitions of the action are provided.

The effect of the DM conditions is that the Aregister is always a multiple of the last delta added (at F13). The dyadic condition ensures that the binary representation of delta has exactly one "1" bit. The monotonic condition ensures that delta not become larger until a code symbol is produced, so that the bit in delta remains only in the same position or moves to the right. This situation remains until a code symbol is produced, at which point the Aregister becomes zero (precisely because only the Aregister bits to the right of the last delta are preserved).

As a result, the following set of properties of Table 3 is provided.

TABLE 3

| | |
|---|---|
| a) | A is a multiple of delta |
| b) | A is zero after writing a code symbol |
| c) | Renormalization after writing a code symbol is unnecessary |

For this same reason, the Cregister, required in general arithmetic coding, is not necessarily used in the DM encoder. Immediately after producing a code symbol, the entire memory of the preceding state sequence is captured in the context. Since the context is the previous k input symbols, the DM codec has a short-term memory and consequently adapts quickly to the local statistics of the input string.

Various applications of the present framework exist. For example, in the context of significant functions; image, video, and signal processing often involves a transform whose purpose is to "concentrate" the signal, i.e., produce a few large coefficients and many negligible coefficients (which are discarded by replacing them with zero). The identity (or location) of the non-negligible coefficients is usually as important as their values. This information is often captured in a "significance function" which maps non-negligible coefficients to "1" and negligible ones to "0."

By listing the coefficients and their significance bits in an appropriate order, a significance bit can be predicted with good accuracy from its immediate predecessors. If that order lists the coefficients in descending order by their expected magnitude, one may obtain a significance bit string that begins with predominantly 1's and ends with predominantly 0's. Such a string, whose statistics change as the string goes on, is called non-stationary. Effective entropy coding of such a string may require a memory of the immediately preceding context. This memory may be extensive enough to achieve good prediction accuracy and short-lived enough to allow sufficiently rapid adaptation.

In the context of coding non-stationary runs and in accordance with the aforementioned definition, a run within the significance function may include a substring of bits where all but the last bit have one value and the last bit has the other value. The next run begins immediately after the last bit of the preceding run.

As a general rule, the more bits in context (the larger k), the more closely the coding rate approximates the limiting entropy. However, the larger k, the more expensive the implementation. The range of k is sufficiently limited that each of the values of k can be examined. Once k is selected, the performance of the DM codec for non-stationary runs is captured entirely in the mps(context) and delta(context) functions. These functions may be approximated from empirical data as follows in Table 4.

TABLE 4

| | |
|---|---|
| 1) | mps(context) = 1 if Prob(next symbol = 1 \| context) ≧ 0.5 |
| 2) | Prob($2^{2 \cdot delta(context)}$ \| context) = 0.5 |

The procedure is to collect sufficient empirical data, qualified by context, and for each context form a histogram. From this, the probability functions can be approximated. The function mps(context) can be calculated directly. Moreover, the function delta(context) can be calculated by an iterative solution of 2) above in Table 4.

The DM codec thus maps input strings 1:1 into coded strings and a coded string, when decoded, yields the original input string. Not all output strings can necessarily be generated by encoding some input string. Some input strings may encode to shorter coded strings—many may encode to longer coded strings. Regarding the length of an input string vis-à-vis the coded string to which it encodes, it may be helpful to describe the probabilities of occurrence of various possible input strings. If the codec has useful compression properties, it may be that the probability of occurrence of an input string which encodes to a short string is much larger than the probability of occurrence of an input string which encodes to a long string.

Dynamic probabilities need not necessarily apply. For entropy coding applications, the statistics of the significance bitstream can and does change often and precipitously. Such changes cannot necessarily be tracked by adaptive probability tables, which change only slowly even over many runs. The DM coder therefore does not necessarily use probability tables; but rather adapts within either the last few bits or within a single run.

Empirical tests with data derived from significance bits indicate that most of the benefit of the context is obtained with only the last few bits of the significance bit string. These last few bits of the significance string, as context, are used to condition the probability of the next bit.

The important probability quantity $p_{context}$=Prob(next input bit=LSB|context). It may be noted that, by the definition of LSB, $p_{context}$<0.5. The entropy that may be added to minimally represent that next bit is as follows in Table 5.

TABLE 5

| |
|---|
| entropy = $-((1 - p_{context})*\log_2(1 - p_{context}) + p_{context} * \log_2(p_{context}))$ bits |

Then delta(context)=entropy/2 because the Aregister is scaled to output the $2^{-1}$ bit. If $p_{context}$~0.5, then the entropy that may be added for that next bit is approximately as follows in Table 6.

TABLE 6

| |
|---|
| $-((1 - 0.5)*\log_2(1 - 0.5) + 0.5 * \log_2(0.5)) \sim 1$ bit |

Moreover, delta(context)=½. If $p_{content}$<<0.5, the entropy that may be added for that next bit is approximately that set forth in Table 7.

TABLE 7

| |
|---|
| $(1 - p_{context})*(-p_{context}) - p_{context} * \log_2(p_{context}) \sim p_{context} * \log_2(1/p_{context})$ |

Moreover, delta(context)=$p_{context}*\log_2(1/p_{context})/2$. See equation 2) above in Table 4. Additional information relating to Rice Golomb techniques which may optionally be incorporated into the present embodiment may be found with reference to U.S. Pat. Nos. 6,272,180, and 6,381,280; which are incorporated herein by reference in their entirety.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A coder comprising a variable modulus, wherein the coder compresses data by mapping an input sequence of symbols into a coded sequence of the symbols, and the variable modulus is utilized during the data compression, where each symbol of the input sequence is drawn from an associated finite alphabet of input symbols and each symbol of the coded sequence is drawn from an associated finite alphabet of code symbols.

2. The coder as recited in claim 1, wherein the modulus reflects a steepness of a probability distribution curve associated with a compression algorithm.

3. The coder as recited in claim 2, wherein the modulus includes a negative exponential of the probability distribution.

4. The coder as recited in claim 2, wherein the probability distribution is associated with a codec.

5. The coder as recited in claim 2, wherein the codec is designed to utilize a minimal computational complexity given a predetermined performance level.

6. The coder as recited in claim 1, wherein the modulus depends on a context of a previous set of data.

7. The coder as recited in claim 1, wherein the modulus avoids increasing as a function of a run length.

8. The coder as recited in claim 7, wherein the run length includes a plurality of identical bits in a sequence.

9. The coder as recited in claim 1, wherein the coder includes an entropy coder.

10. A decoder comprising a variable modulus, wherein the decoder is a component of a codec that compresses data by mapping an input sequence of symbols into a coded sequence of the symbols, and the variable modulus is utilized during the data compression, where each symbol of the input sequence is drawn from an associated finite alphabet of input symbols and each symbol of the coded sequence is drawn from an associated finite alphabet of code symbols.

11. The decoder as recited in claim 10, wherein the modulus reflects a steepness of a probability distribution curve associated with a compression algorithm.

12. The decoder as recited in claim 11, wherein the modulus includes a negative exponential of the probability distribution.

13. The decoder as recited in claim 11, wherein the probability distribution is associated with a codec.

14. The decoder as recited in claim 11, wherein the codec is designed to utilize a minimal computational complexity given a predetermined performance level.

15. The decoder as recited in claim 10, wherein the modulus depends on a context of a previous set of data.

16. The decoder as recited in claim 10, wherein the modulus avoids increasing as a function of a run length.

17. The decoder as recited in claim 16, wherein the run length includes a plurality of identical bits in a sequence.

18. The decoder as recited in claim 10, wherein the decoder includes an entropy decoder.

19. A method for using a codec including a variable modulus that reflects a steepness of a probability distribution curve associated with a compression algorithm and does not increase with a run length, wherein the codec compresses data by mapping an input sequence of symbols into a coded sequence of the symbols, and the variable modulus is utilized during the data compression, where each symbol of the input sequence is drawn from an associated finite alphabet of input symbols and each symbol of the coded sequence is drawn from an associated finite alphabet of code symbols.

20. The method as recited in claim 19, wherein the variable modulus includes $-\log_2(\text{delta})$, where delta is a negative integral power of two.

21. The method as recited in claim 19, wherein the codec utilizes:

a) a dyadic constraint as follows:

$$\text{delta(context)} = 2^{-m} \quad 0 < m \leq n,$$

where m and n are integers, and delta includes a negative integral power of two, and b) a monotonic constraint as follows:

$$(1-\text{delta(context)}) \leq (1-\text{delta}((2*\text{context} \bmod 2^k) + \text{mps(context)})),$$

where $(1-\text{delta}((2*\text{context} \bmod 2^k)+\text{mps(context)}))$ is approximately a probability of reading a most probable symbol given that a previously read symbol was also most probable.

* * * * *